United States Patent [19]
McNeal et al.

[11] Patent Number: 4,643,935
[45] Date of Patent: Feb. 17, 1987

[54] EPOXY-GLASS INTEGRATED CIRCUIT PACKAGE HAVING BONDING PADS IN A STEPPED CAVITY

[75] Inventors: Norman E. McNeal, Carlsbad; Richard A. Nagy, Leucadia; Ronald A. Norell, Carlsbad, all of Calif.

[73] Assignee: Burroughs Corporation, Detroit, Mich.

[21] Appl. No.: 819,995

[22] Filed: Jan. 21, 1986

[51] Int. Cl.⁴ .................... B32B 3/10; B32B 27/38
[52] U.S. Cl. .................................. 428/157; 428/172; 428/189; 428/190; 428/414; 428/417
[58] Field of Search ............... 428/77, 78, 156, 157, 428/172, 189, 190, 192, 414, 417

[56] References Cited

U.S. PATENT DOCUMENTS

| | | | |
|---|---|---|---|
| 3,809,601 | 5/1974 | Fletcher | 428/189 |
| 4,407,883 | 10/1983 | Newton | 428/417 |
| 4,477,512 | 10/1984 | Thomas et al. | 428/417 |
| 4,495,239 | 1/1985 | Pusch et al. | 428/192 |
| 4,526,641 | 7/1985 | Schriever et al. | 428/189 |

FOREIGN PATENT DOCUMENTS 2362584  6/1975  Fed. Rep. of Germany ........ 428/78

Primary Examiner—William J. Van Balen
Attorney, Agent, or Firm—Charles J. Fassbender; Kevin R. Peterson

[57] ABSTRACT

An integrated circuit package comprises a plurality of thin flat epoxy-glass layers which are arranged in a stack and are laminated together by prepreg layers that lie between the epoxy-glass layers. This stack has a cavity which is staircase-shaped and extends from an outer epoxy-glass layer to an internal epoxy-glass layer, goes parallel along the internal epoxy-glass layer and then penetrates through it. Patterned electrical conductors lie on the flat surface of the internal epoxy-glass layer, including wire bonding pads on its exposed flat surface portion.

12 Claims, 7 Drawing Figures

EPOXY-GLASS INTEGRATED CIRCUIT PACKAGE HAVING BONDING PADS IN A STEPPED CAVITY

RELATED COPENDING APPLICATIONS

"Elastic Bladder Method of Fabricating an Integrated Circuit Package Having Bonding Pads in a Stepped Cavity," by Ronald A. Norell, filed Jan. 21, 1986, Ser. No. 819,994.

"Thermoplastic Plug Method of Fabricating an Integrated Circuit Package Having Bonding Pads in a Stepped Cavity," by Norman E. McNeal and Richard A. Nagy, filed Jan. 21, 1986, Ser. No. 819,996.

BACKGROUND OF THE INVENTION

This invention relates to integrated circuit packages and methods for fabricating such packages.

One common integrated circuit package of the prior art is comprised of a plurality of thin flat ceramic layers which are laminated together and which have a cavity that holds an integrated circuit chip. This cavity in cross section has staircase-shaped sidewalls. Patterned electrical conductors lie on the surfaces of the ceramic layers; and, on the steps of the cavity, these conductors are shaped as wire bonding pads. Discrete wires are bonded between these bonding pads and the integrated circuit chip to carry signals to and from the chip.

Since the cavity is staircase-shaped, several rows of bonding pads lie around the chip. This is desirable because it enables a large number of signals to be sent to and from the chip. A trend in integrated circuits is to increase the number of these signals, and today chips are fabricated with over 100 bonding pads.

A problem, however, with the above described integrated circuit package is that it is expensive to manufacture. One factor in this expense is the cost of a furnace which is needed to cure the ceramic at temperatures of about 2800° F. Also, the furnace must be operated 24 hours a day to keep its temperature stable.

Another factor is this expense is low yield. During the curing process, the ceramic shrinks at rates which are very difficult to control and this makes some packages unusable. Also during the curing process, blisters can occur between some of the ceramic layers in the packages; and some of the conductors may not properly adhere to the ceramic layers. These problems combined typically lower the yield of ceramic packages to only 5%–50%.

Accordingly, efforts have been made to develop a lower cost package; and to that end, epoxy-glass has been used in place of ceramic. This change of materials eliminates all of the above described furnace problems, shrinkage problems, blister problems, and conductor adhesion problems. However, with epoxy-glass packages, adhesive layers are needed between the epoxy-glass layers in order to laminate and permanently hold the epoxy-glass layers together. No such adhesive is needed in ceramic packages, and this adhesive causes new problems.

Specifically, during lamination of the epoxy-glass layers, the adhesive softens and flows; and if the adhesive flows over the bonding pads on the steps of the staircase-shaped cavity, the package becomes unusable. A cured adhesive on the bonding pads cannot be removed without destroying the pads.

In the prior art, no method was provided for stopping such a flow of the adhesive. Consequently, epoxy-glass packages were not made with staircase-shaped sidewalls. Instead, the cavity merely had vertical sidewalls and the bonding pads were placed on only the top epoxy-glass layer. This, however, has a serious drawback in that it severely limits the number of signals that can be sent to and received from the integrated circuit chip.

Accordingly, a primary object of the invention is to provide an improved integrated circuit package and method of fabricating same which overcomes all of the above prior art problems.

BRIEF SUMMARY OF THE INVENTION

In accordance with the present invention, an integrated circuit package comprises a plurality of thin flat epoxy-glass layers which are arranged in a stack and are laminated together by prepreg layers that lie between the epoxy-glass layers. This stack has a cavity which is staircase-shaped and extends from an outer epoxy-glass layer to an internal epoxy-glass layer, goes parallel along the internal epoxy-glass layer and then penetrates through it. Patterned electrical conductors lie on the flat surface of the internal epoxy-glass layer, including wire bonding pads on its exposed flat surface portion.

BRIEF DESCRIPTION OF THE DRAWINGS

Various features and advantages of the invention are described in the Detailed Description in accordance with the accompanying drawings wherein.

DETAILED DESCRIPTION OF THE INVENTION

Figure 1:
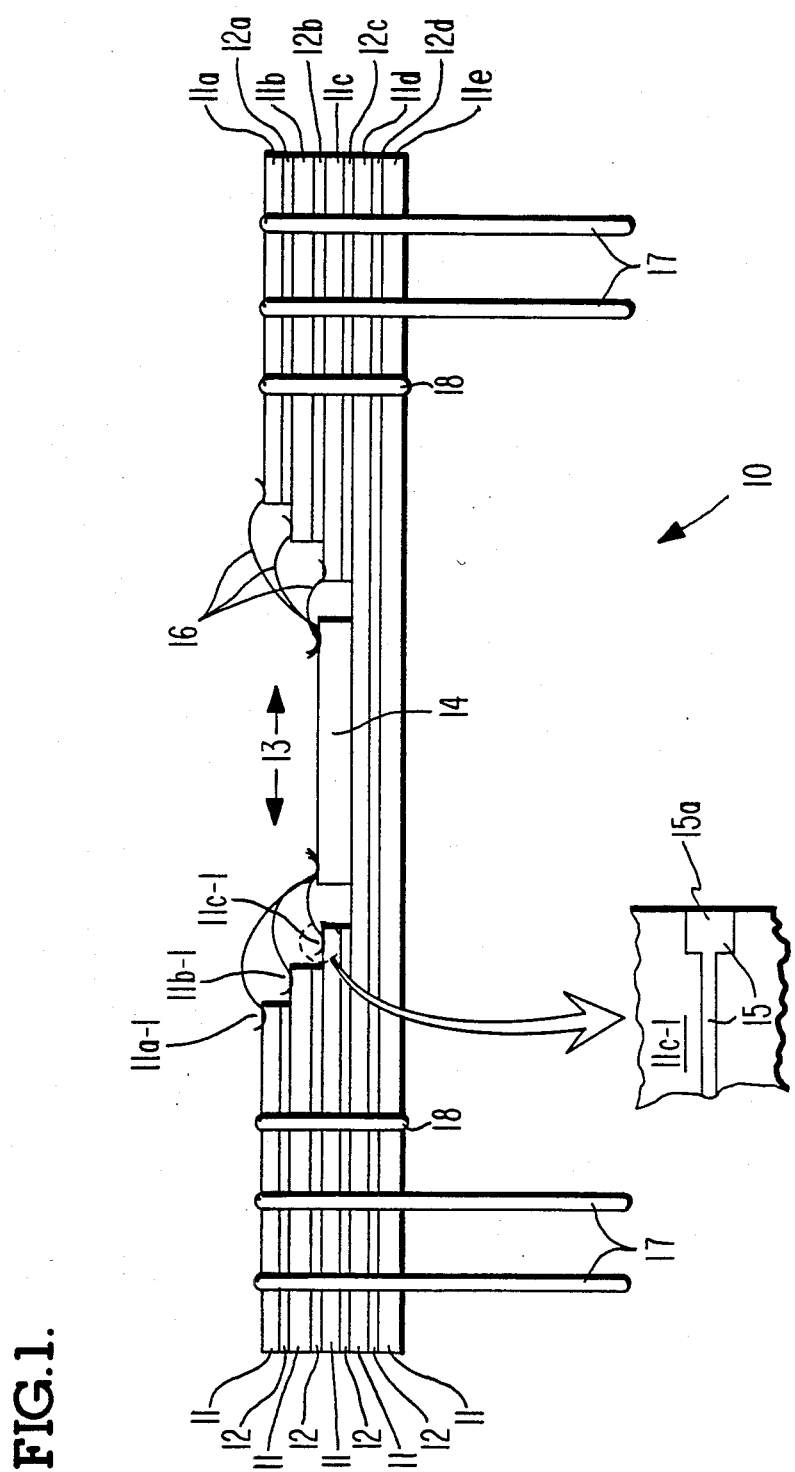
FIG. 1 is a greatly enlarged cross-sectional view of a preferred embodiment of an integrated circuit package that is constructed in accordance with the invention.

Referring now to FIG. 1, the details of a novel integrated circuit package 10 will be described. Package 10 includes a total of five thin flat epoxy-glass layers 11 which are arranged in a stack. These epoxy-glass layers are held together by respective adhesive layers 12 which lie between the epoxy-glass layers. Suitably the adhesive layers are made of prepreg.

In FIG. 1, the layers 11 and 12 are shown in cross section at approximately five times the size of the actual package. In the actual embodiment, each of the layers 11 and 12 is square in shape and 1.5 inches on a side. Also, each of the epoxy-glass layers 11 is 0.015 inches thick, and each of the adhesive layers 12 is 0.004 inches thick.

Package 10 also has a cavity 13 in which an integrated circuit die 14 is disposed. This cavity 13 penetrates through layers 11a, 12a, 11b, 12b, 11c, and 12c. In cross section, cavity 13 is staircase-shaped so that it exposes a portion 11b-1 of the flat surface of layer 11b and exposes a portion 11c-1 of the epoxy-glass flat surface of layer 11c. Cavity 13 is 0.66 inches wide in layers 11a and 12a, 0.56 inches wide in layers 11b and 12b, and 0.46 inches wide in layers 11c and 12c.

Layers 11a, 11b and 11c have patterned electrical conductors on their flat surface. These conductors are only about 0.001 inches high, which is too thin to show in cross section. However, one such conductor is indicated from a top view by reference numeral 15. These conductors are provided to carry electrical signals to and from chip 14. To accomplish that, each conductor includes a bonding pad 15a on one of the exposed surface portions 11a-1, 11b-1 and 11c-1.

Signals are carried between the bonding pads 15a and corresponding pads on chip 14 by a plurality of discrete bonding wires 16. To carry signals to and from the package itself, a plurality of metal pins 17 are provided which fit tightly into respective narrow holes in the layers 11 and 12 and make contact with the conductors 15. Metal plated holes 18 are provided which contact the electrical conductors 15 on two epoxy-glass layers at the same time and thereby transfer signals from one layer to the other.

Figure 2:
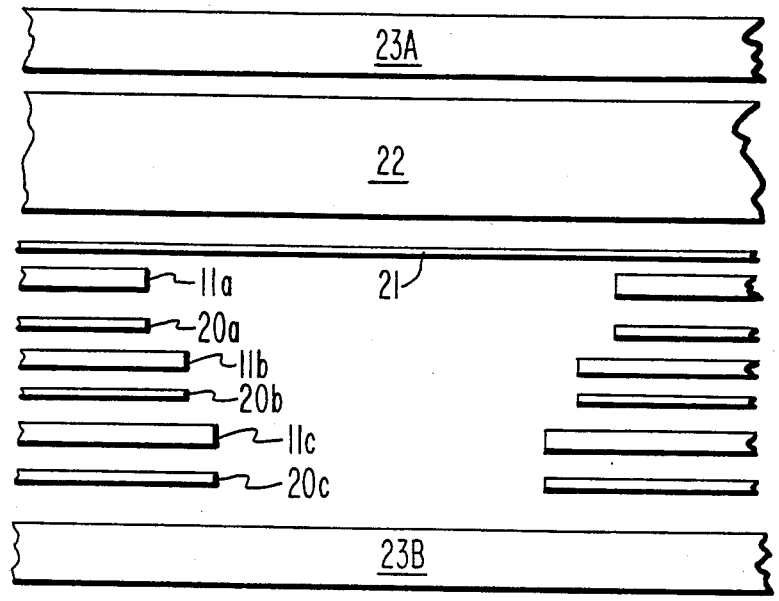
FIGS. 2-5 illustrate the steps of one preferred method of fabricating the integrated circuit package of FIG. 1.
Figure 3:
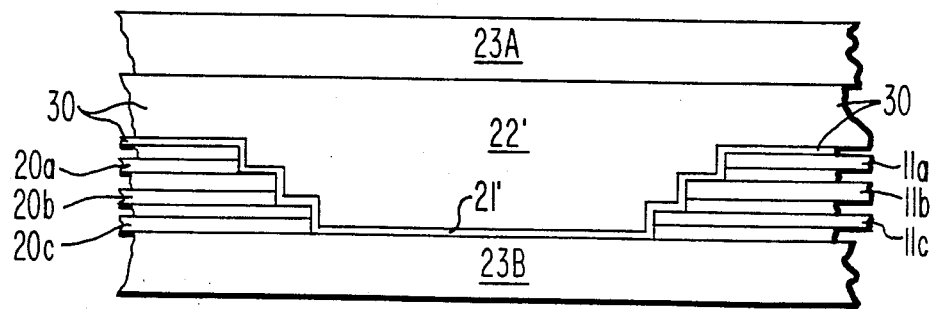

Turning now to FIGS. 2-5, the details of a method for constructing the FIG. 1 integrated circuit package will be described. In this method, a thermoplastic plug is used which has a shape that closely matches the shape of cavity 13; and the steps for forming such a plug are illustrated in FIGS. 2 and 3.

To begin, all of the epoxy-glass layers through which the cavity 13 penetrates (i.e., layers 11a, 11b, and 11c) are assembled in a stack. Between those layers, non-adhesive "dummy" layers 20a, 20b, and 20c are disposed. These "dummy" layers have the same thickness and cavity shape as the adhesive layers 12a, 12b, and 12c; and suitably, they are comprised of epoxy-glass.

A thin sheet 21 of a "release" material (i.e., a material which does not stick to the epoxy-glass layers 11a–11c and the adhesive layers 12a–12d under high temperature and pressure) is placed on top of the assembly. Suitably, sheet 21 is a 0.001 inch thick sheet of Tedlar. Thereafter, a layer 22 of thermoplastic material is placed on top of sheet 21. Suitably, layer 22 is a 0.060 inch thick layer of a polyvinyl chloride, a polyolefin, or a polycarbonate.

All of the above described FIG. 2 layers are then compressed by two pressure plates 23a and 23b. This compression occurs at a temperature which causes the thermoplastic layers 22 to soften, and at a pressure which forces the softened thermoplastic material to completely fill the cavity that is formed by layers 11a–11c and 20a–20c.

Suitably this compression occurs at 300° F. and 300 psi and lasts for 40 minutes. FIG. 3 shows the result of this compression step. In that figure, reference numeral 30 indicates the finished thermoplastic plug which consists of the shaped thermoplastic material 22' and its surface film 21' of release material.

Figure 4:
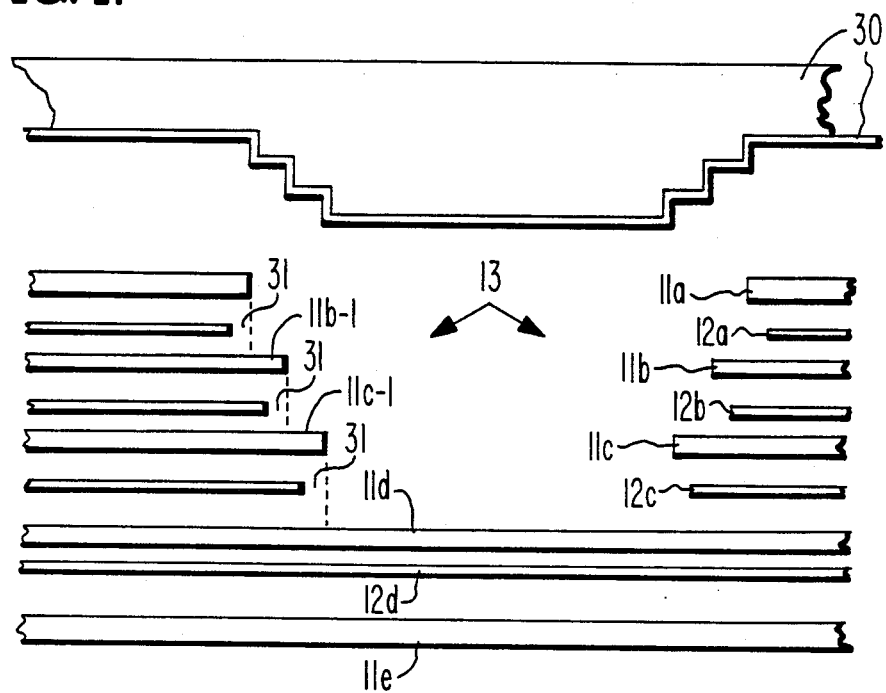
Figure 5:
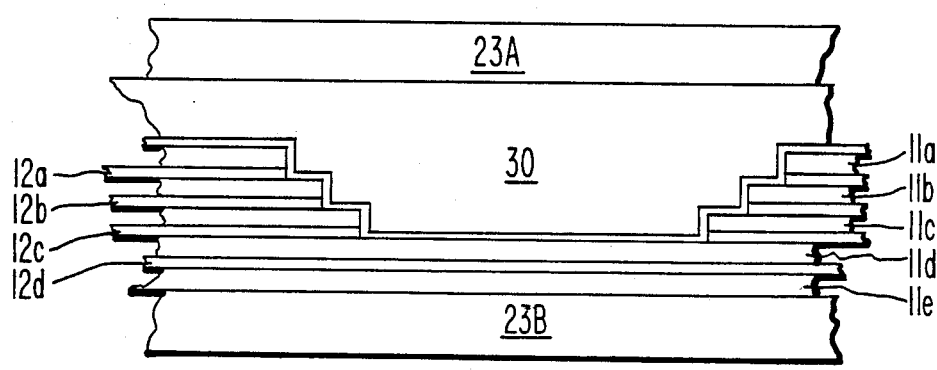

Turning next to FIGS. 4 and 5, the steps by which the thermoplastic plug 30 is used to fabricate the integrated circuit package 10 will be described. To begin, all of the epoxy-glass layers 11a–11e are assembled in a stack, and all of the adhesive layers 12a–12d are interleaved between the epoxy-glass layers. Preferably, those adhesive layers through which cavity 13 extends (i.e., layers 12a, 12b, and 12c) are recessed at the cavity from their overlying epoxy-glass layer. This recess is indicated by reference numeral 31, and suitably, it is 0.020 inches.

Note that prior to making the FIG. 4 assembly, the previously described patterned conductors 15 have already been formed on the internal epoxy-glass layers. These conductors are formed by conventional steps such as attaching a thin unpatterned copper film to one surface of each internal epoxy-glass layer, patterning a layer of photoresist over the copper film in accordance with the desired conductor pattern, and using a chemical etchant to remove all portions of the copper film which are not covered by the photoresist. In performing these steps, the previously described bonding pads 15a in the regions 11b-1 and 11c-1 are also fabricated.

After layers 11 and 12 are assembled as per FIG. 3, the thermoplastic plug 30 is inserted into the cavity 13. Due to the manner in which plug 30 is made (i.e., by the process steps of FIGS. 2 and 3), plug 30 will fit snugly into cavity 13. However, small voids between the plug and some of the layers 11a, 11b, 11c, 12a, 12b, and 12c sidewalls of the cavity will always occur. Preferably, the width of plug 30 should be no more than 0.005 inches smaller than the width of cavity 13.

Thereafter, the stacked layers 11 and 12 with the inserted plug 30 is placed between the pressure plates 23a and 23b of a press and laminated. This lamination occurs at a temperature and pressure which causes the plug 30 to soften and conform exactly to the shape of cavity 13. Suitably, this lamination occurs at a temperature of 350° F. and a pressure of 300 psi and lasts for 60 minutes. FIG. 5 illustrates the result of this step.

An important feature of the above described fabrication process is that no adhesive from any adhesive layer flows over the bonding pads on surfaces 11b-1 and 11c-1. This is because plug 30 softens during the lamination process before the adhesive softens, and so it fills all voids between the plug and the layers 11 and 12 before the adhesive layers 11 soften. For example, a polyvinyl chloride plug 30 softens at 160° F. -200° F. whereas prepreg adhesive layers 12 soften at 250° F.-260° F.

Thus, plug 30 acts as a dam which prevents the adhesive in layers 12a, 12b, and 12c from flowing onto the bonding pads. Without this damming action, the adhesive would flow over and harden on the bonding pads, and that would make the package unusable since the hardened adhesive cannot be removed without severely damaging the package.

Another important feature of the above described process is that during lamination, pressure is applied uniformly over all of the flat surfaces of the layers 11 and 12, including the bonding pad regions 11b-1 and 11c-1. This uniformity in pressure is another result of the thermoplastic plug softening and conforming exactly to the shape of cavity 13. Consequently, the "steps" on which the bonding pads 15a are located are square and not sloped, the thickness of the adhesive layers 12 is uniform, and tolerances on the thickness of the epoxy-glass layers 12 can be relaxed and thereby lower manufacturing costs.

After the lamination step of FIG. 5 is complete, the laminated layers 11 and 12 are removed from the press, and the thermoplastic plug 30 is removed from cavity 13. Thereafter, respective narrow holes are drilled for each of the metal pins and metal plated holes in the package, pins 17 are fitted into their holes and soldered in place, and the remaining holes 18 are metal plated.

Figure 6:
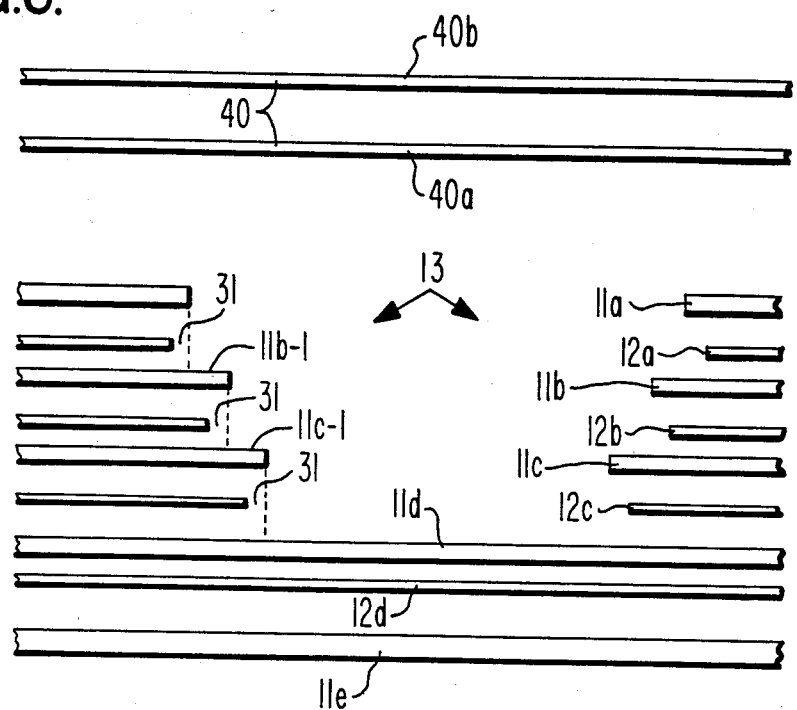
FIGS. 6-7 illustrate the steps of another preferred method of fabricating the integrated circuit package of FIG. 1.

Next, referring to FIGS. 6 and 7, still another process for fabricating the integrated circuit package 10 will be described. With this process, no preformed thermoplastic plug is needed. Instead, each of the epoxy-glass layers 11a–11e and the adhesive layers 12a–12d are arranged in a stack just as they were in FIG. 4. Subsequently, as FIG. 6 shows, the outer epoxy-glass layer 11a of this stack is covered with a thin (e.g., 0.030 inch thick) elastic bladder 40. Suitably, the bladder 40 is made of rubber or any other elastomer which can withstand the temperatures and pressures that occur during lamination.

Bladder 40 and the stacked layers 11 and 12 are placed in an enclosed rigid box 41, and thereafter a fluid 42 is forced into the bladder. This occurs at a pressure and temperature which causes the bladder's membrane 40a to stretch and push against all the surfaces of cavity 13. At the same time layers 11a–11e and 12a–12d are laminated together. This is illustrated in FIG. 7 wherein the arrows 42 indicate the pressurized fluid. Here, as with the thermoplastic plug, a suitable pressure and temperature is 300 psi at 350° F. for 60 minutes.

With membrane 40a so stretched, it acts as a dam for the adhesive in layers 12a, 12b, and 12c and prevents the adhesive from flowing onto the bonding pads 15a. In addition, the fluid 42 operates to distribute the pressure uniformly over all of the flat surfaces of layers 11a–11e and 12a–12d. Consequently, the steps in cavity 13 are square, no localized overthinning of the adhesive layers occurs, and tolerances on the thickness of the layers 11 and 12 can be relaxed.

Figure 7:
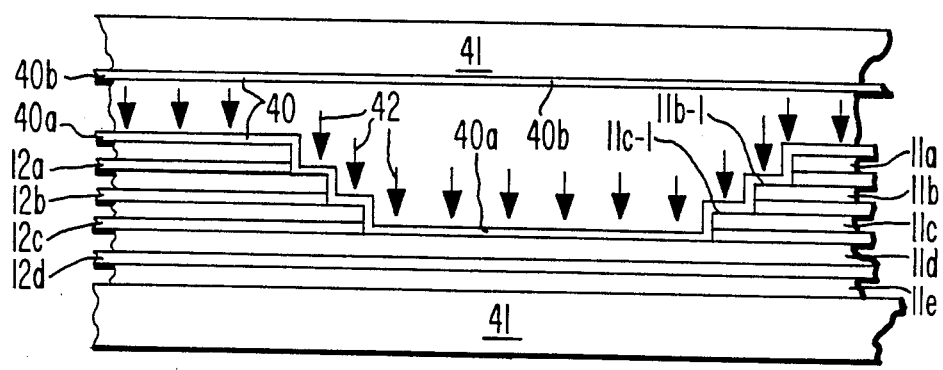

This method of FIGS. 6 and 7 also has an added advantage over the method of FIGS. 2–5 in that a single bladder 40 works for all cavity sizes. Thus, a separate preformed plug is not needed for each different cavity size.

Another added feature of the method of FIGS. 6 and 7 is that it doesn't incorporate the use of a press; only a box and a fluid pump are used. This reduces the method's cost since a box and a hand pump can be obtained for about $100 whereas a press costs several thousand dollars.

Still another added feature of the method of FIGS. 6 and 7 is that after the lamination step is complete, the elastic membrane 40a can be removed from cavity 13 more easily than a plug. This is because when the pressure in fluid 42 is reduced, the elastic membrane 40a will tend to return to its flat unstretched state and thereby come out of the cavity by itself.

All of the details of a novel integrated circuit package as well as two methods for fabricating that package have now been completely described. In addition, however, many changes and modifications can be made to these details without departing from the nature and spirit of the invention.

For example, the adhesive layers 12a–12d can be made of all types of prepreg, i.e.—all fabric supported thermosetting resins which have been cured to an intermediate stage. Suitable fabric materials include glass, Tedlar, and quartz; and suitable resins include epoxy, polyimide, triazine, teflon, and acrylics. Alternatively, the adhesive layers 12a–12d can be made of a sheet of partially cured thermosetting resin without any interwoven fabric material. Also, the thickness of these adhesive layers can vary, but preferably the thickness is at least 0.002 inches so that when the adhesive softens during lamination, it has enough volume to fill the spaces between the conductors 15.

In addition, layers 11a–11e are not limited to epoxy-glass; they can be fabricated from any dielectric material. Suitable materials include fabric supported thermosetting resins as identified above but which have been fully cured, and those same thermosetting resins without any interwoven fabric which have been fully cured.

Another dielectric for layers 11a–11e is ceramic. When ceramic layers are assembled in accordance with the process steps of FIGS. 2, 4, and 6, those ceramic layers are in their uncured or green state; and the process steps of FIGS. 5 and 7 compress the ceramic layers to a state where they can be cured in a furnace.

When the layers 11a–11e are made of ceramic, they may be laminated together without an adhesive between them. In that case, the dummy layers 20a–20c in FIGS. 2 and 3 and the adhesive layers 12a–12d in FIGS. 4–7 are eliminated. Alternatively, a light spray of an adhesive may be put on the surface of layers 11a–11c prior to their lamination. Ceramic layers with and without adhesive between them may be laminated together by the steps of FIGS. 5 and 7 at a temperature of 130° F. and a pressure of 1250–1650 psi for two minutes.

When ceramic is being cured, it has a tendency to shrink, and the degree to which it shrinks varies inversely with the ceramic's density. With the above method, all of the green ceramic layers are compressed to a uniform density throughout the package; and so during curing, all layers throughout the package shrink uniformly. Thus, with the above method, the registration of the conductors 15 and the bonding pads 15a around cavity 13 is very accurate.

Green ceramic almost always contains small quantities of moisture; and during lamination this moisture vaporizes and tries to escape from the package. If the pressure during lamination is not applied uniformly on all of the green ceramic layers, this gas will become trapped between any two layers where the pressure is low and thereby create a "blister". But with the method of FIGS. 2–5 and 6–7, pressure is applied uniformly to the ceramic layers and so no such blisters occur.

In addition, the conductors 15 on the green ceramic layers extend slightly above the layers' flat surface (e.g., 0.001 inches above); and if pressure is applied to these conductors nonuniformly during lamination, they will get squashed into the ceramic at nonuniform depths. This is undesirable because it causes the conductors to adhere to the ceramic nonuniformly. But with the methods of FIGS. 2–5 and 6–7, all squashing occurs uniformly since a uniform pressure is applied to the conductors and the ceramic at the same time. Thus the degree with which all the conductors adhere to the ceramic in the finished package is uniform and can be controlled.

As another modification to the above described details, the number of layers in the package 10 may be increased. For example, by providing an additional layer 11 and an additional layer 12 and by extending cavity 13 through them in a staircase-shaped fashion, extra bonding pads can be placed around the cavity for the integrated circuit chip 14.

Still another modification to the above described details is that the preformed plug 30 which is fabricated by the steps of FIGS. 2 and 3 may be made of a material other than a thermoplastic. Any material that softens under the temperature and pressure that is used during lamination and does not irreversibly harden upon cooling may be used. For example, a low durometer rubber (i.e., one with a durometer rating of less than Shore A 30) may be used in place of the thermoplastic material.

As yet another modification, the bladder 40 of FIGS. 6 and 7 need not be a sack or a bag that is elastic on all sides. Only the side 40a which presses against the top layer 11a of the stack need be an elastic membrane; the other side 40b can be a rigid sheet or housing.

Also, the temperature and pressure at which lamination occurs in the steps of FIGS. 3, 5 and 7 are not limited to those which were previously stated. Preferably, however, these lamination steps are carried out at pressures of at least 50 psi and temperatures of at least 100° F.

Accordingly, since many such modifications can be made to the above details without departing from the nature and spirit of the invention, it is to be understood that the invention is not limited to those details but is defined by the appended claims.

What is claimed is:

1. An integrated circuit package comprising:
  a plurality of thin flat epoxy-glass layers which are arranged in a stack and are laminated together by prepreg layers that lie between the epoxy-glass layers;
  said stack having a cavity which is staircase-shaped and extends from an outer epoxy-glass layer to an internal epoxy-glass layer, and goes parallel along a portion of the flat surface of said internal epoxy-glass layer and then penetrates it; and
  patterned electrical conductors on the flat surface of said internal epoxy-glass layer including wire bonding pads on its exposed flat surface portion.

2. An integrated circuit package according to claim 1 wherein said prepreg in said package is blocked from flowing onto said bonding pads while said layers are laminated together by the placement of a thermoplastic plug in said cavity.

3. An integrated circuit package according to claim 1 wherein said prepreg in said package is blocked from flowing onto said bonding pads while said layers are laminated together by an elastic bladder which is stretched and forced into said cavity by a pressurized fluid.

4. An integrated circuit package according to claim 1 wherein said cavity penetrates through multiple internal epoxy-glass layers and exposes respective flat surface portions on each of them, and wherein wire bonding pads are disposed on each of the exposed flat surface portions.

5. An integrated circuit package according to claim 1 wherein wire bonding pads are disposed around said cavity on said outer epoxy-glass layer.

6. An integrated circuit package according to claim 1 wherein said adhesive is at least 0.002 inches thick.

7. An integrated circuit package comprising:
  a stack of thin flat first type layers which are made of a fully cured thermosetting resin and are laminated together by second type layers that are made of an adhesive and lie between the first type layers;
  said stack having a cavity which extends from an outer first type layer through an internal first type layer and is shaped to expose a portion of the flat surface of said internal first type layer; and
  wire bonding pads on said exposed flat surface portion of said internal first type layer.

8. An integrated circuit package according to claim 7 wherein said adhesive layers are selected from an epoxy, triazine, polyimide, teflon, and an acrylic.

9. An integrated circuit package according to claim 7 wherein a fabric is interwoven in said adhesive.

10. An integrated circuit package according to claim 7 wherein said adhesive is at least 0.002 inches thick.

11. An integrated circuit package according to claim 7 wherein said adhesive in said package is blocked from flowing onto said bonding pads while said layers are laminated together by the placement of a thermoplastic plug in said cavity.

12. An integrated circuit package according to claim 7 wherein said adhesive in said package is blocked from flowing onto said bonding pads while said layers are laminated together by an elastic membrane which is stretched and forced into said cavity by a pressurized fluid.

* * * * *